United States Patent
Xiong

(10) Patent No.: US 11,250,756 B2
(45) Date of Patent: Feb. 15, 2022

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Rui Xiong, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/019,387

(22) Filed: Sep. 14, 2020

(65) Prior Publication Data

US 2021/0319734 A1    Oct. 14, 2021

(30) Foreign Application Priority Data

Apr. 13, 2020  (CN) .......................... 202010286146.2

(51) Int. Cl.
  *G09G 3/20*   (2006.01)
  *G01R 31/28*  (2006.01)

(52) U.S. Cl.
  CPC .......... *G09G 3/20* (2013.01); *G01R 31/2849* (2013.01); *G09G 2300/0408* (2013.01); *G09G 2310/0202* (2013.01); *G09G 2310/0267* (2013.01)

(58) Field of Classification Search
  CPC combination set(s) only.
  See application file for complete search history.

(56) References Cited

U.S. PATENT DOCUMENTS

| | | | |
|---|---|---|---|
| 2013/0002529 A1 | 1/2013 | Onogi | |
| 2018/0082643 A1 | 3/2018 | Jeong et al. | |
| 2021/0020732 A1* | 1/2021 | Watanabe | ........... H01L 27/3276 |
| 2021/0201721 A1* | 7/2021 | Li | .......................... G09G 3/035 |

FOREIGN PATENT DOCUMENTS

| | | |
|---|---|---|
| CN | 1622704 | 6/2005 |
| CN | 101064334 | 10/2007 |
| CN | 106526918 | 3/2017 |
| CN | 107342036 | 11/2017 |
| CN | 107633807 | 1/2018 |

(Continued)

OTHER PUBLICATIONS

CN107678219 (A)—Feb. 9, 2018 Ying Jianjian (Year: 2018).*

*Primary Examiner* — Van N Chow

(57) ABSTRACT

A display panel and a manufacturing method thereof are provided. The display panel includes a substrate, and a first connecting line, a second connecting line, a first GOA circuit, and a second GOA circuit disposed on the substrate. The first GOA circuit is disposed opposite to the second GOA circuit, and a first single-sided driving area and a second single-sided driving area are sequentially disposed between the first GOA circuit and the second GOA circuit. The first connecting line is disposed in the first single-sided driving area and connected to an input terminal of the first GOA circuit, and the second connecting line is disposed in the second single-sided driving area and connected to an input terminal of the second GOA circuit. The present disclosure can prevent screen tearing which is caused by single-sided driving when performing an aging test, and improve a yield of the display panel.

10 Claims, 3 Drawing Sheets

(56) References Cited

FOREIGN PATENT DOCUMENTS

| CN | 108010949 | 5/2018 |
| CN | 108511466 | 9/2018 |
| CN | 108615503 | 10/2018 |
| CN | 108877624 | 11/2018 |
| CN | 109147700 | 1/2019 |
| CN | 109283726 | 1/2019 |
| CN | 109491154 | 3/2019 |

* cited by examiner

DISPLAY PANEL AND MANUFACTURING METHOD THEREOF

RELATED APPLICATION

This application claims the benefit of priority of Chinese Patent Application No. 202010286146.2 filed on Apr. 13, 2020, the contents of which are incorporated herein by reference in their entirety.

FIELD AND BACKGROUND OF THE INVENTION

The present disclosure relates to the field of display panel technologies, and more particularly, to a display panel and a manufacturing method thereof.

In order to improve screen ratio, notch screens (display screens having a notch structure) are getting more popular. However, a presence of the notch structure makes output terminals of gate driver on array (GOA) circuits at both sides of the display screens need to use a single-sided driving method. This method has a high requirement for bonding accuracy when lighting, which will cause inconsistencies of input signals of the GOA circuits at the both sides if there is a slight offset when an aging test is performed on a display panel, thereby resulting in screen tearing.

SUMMARY OF THE INVENTION

An embodiment of the present disclosure provides a display panel and a manufacturing method thereof to solve the problem of screen tearing which is easily caused during an aging test process in the display panel.

An embodiment of the present disclosure provides a display panel, which comprises a substrate, and a first connecting line, a second connecting line, a first gate driver on array (GOA) circuit, and a second GOA circuit disposed on the substrate.

Wherein, the first GOA circuit is disposed opposite to the second GOA circuit, and a first single-sided driving area and a second single-sided driving area are sequentially disposed between the first GOA circuit and the second GOA circuit; and the first connecting line is disposed in the first single-sided driving area and connected to an input terminal of the first GOA circuit, and the second connecting line is disposed in the second single-sided driving area and connected to an input terminal of the second GOA circuit.

Further, the display panel further comprises a first scanning line and a second scanning line disposed on the substrate.

Wherein, the first scanning line is disposed in the first single-sided driving area and connected to a first output terminal of the first GOA circuit, and the second scanning line is disposed in the second single-sided driving area and connected to a first output terminal of the second GOA circuit.

Further, a double-sided driving area is further disposed between the first GOA circuit and the second GOA circuit.

Wherein, the display panel further comprises a third scanning line disposed on the substrate, and the third scanning line is disposed in the double-sided driving area and respectively connected to a second output terminal of the first GOA circuit and a second output terminal of the second GOA circuit.

Further, the display panel further comprises a first signal input line and a second signal input line disposed on the substrate.

Wherein, the first signal input line is disposed on one side of the first GOA circuit away from the second GOA circuit, one end of the first signal input line is connected to the input terminal of the first GOA circuit, and another end of the first signal input line is provided with a first lighting test point; and the second signal input line is disposed on one side of the second GOA circuit away from the first GOA circuit, one end of the second signal input line is connected to the input terminal of the second GOA circuit, and another end of the second signal input line is provided with a second lighting test point.

Further, a profile-cutting area is disposed between the first single-sided driving area and the second single-sided driving area.

An embodiment of the present disclosure provides a manufacturing method of a display panel. The method includes following steps:

providing a substrate;

disposing a connecting line, a first gate driver on array (GOA) circuit, and a second GOA circuit on the substrate, wherein the first GOA circuit is disposed opposite to the second GOA circuit, a first single-sided driving area and a second single-sided driving area are sequentially disposed between the first GOA circuit and the second GOA circuit, and the connecting line is disposed in the first single-sided driving area and the second single-sided driving area, and is respectively connected to an input terminal of the first GOA circuit and an input terminal of the second GOA circuit;

respectively inputting a lighting signal to the input terminal of the first GOA circuit and the input terminal of the second GOA circuit to perform an aging test on the display panel; and cutting the substrate and the connecting line between the first single-sided driving area and the second single-sided driving area after the aging test, wherein the connecting line after cutting comprises a first connecting line in the first single-sided driving area and a second connecting line in the second single-sided driving area.

Further, a profile-cutting area is disposed between the first single-sided driving area and the second single-sided driving area, and the connecting line is also disposed in the profile-cutting area.

Specifically, cutting the substrate and the connecting line between the first single-sided driving area and the second single-sided driving area includes a following step:

cutting the substrate and the connecting line in the profile-cutting area.

Further, the method also includes:

disposing a first scanning line and a second scanning line on the substrate, wherein the first scanning line is disposed in the first single-sided driving area and connected to a first output terminal of the first GOA circuit, and the second scanning line is disposed in the second single-sided driving area and connected to a first output terminal of the second GOA circuit.

Further, the method also includes:

disposing a third scanning line on the substrate, wherein a double-sided driving area is further disposed between the first GOA circuit and the second GOA circuit, and the third scanning line is disposed in the double-sided driving area and respectively connected to a second output terminal of the first GOA circuit and a second output terminal of the second GOA circuit.

Further, the method also includes:

disposing a first signal input line and a second signal input line on the substrate, wherein the first signal input line is disposed on one side of the first GOA circuit away from the second GOA circuit, one end of the first signal input line is connected to the input terminal of the first GOA circuit, and another end of the first signal input line is provided with a first lighting test point; and the second signal input line is disposed on one side of the second GOA circuit away from the first GOA circuit, one end of the second signal input line is connected to the input terminal of the second GOA circuit, and another end of the second signal input line is provided with a second lighting test point.

The beneficial effect of the present disclosure is that by disposing the first connecting line in the first single-sided driving area and connecting the first connecting line to the input terminal of the first GOA circuit, and by disposing the second connecting line in the second single-sided driving area and connecting the second connecting line to the input terminal of the second GOA circuit, the first connecting line and the second connecting line are connected when a lighting signal is respectively input to the input terminal of the first GOA circuit and the input terminal of the second GOA circuit, which ensures consistencies of input signals of the GOA circuits at both sides, thereby preventing screen tearing which is caused by single-sided driving when performing an aging test, and improving a yield of the display panel.

BRIEF DESCRIPTION OF THE SEVERAL VIEWS OF THE DRAWINGS

The following detailed description of specific embodiments of the present disclosure will make the technical solutions and other beneficial effects of the present disclosure obvious with reference to the accompanying drawings.

DESCRIPTION OF SPECIFIC EMBODIMENTS OF THE INVENTION

Figure 1:
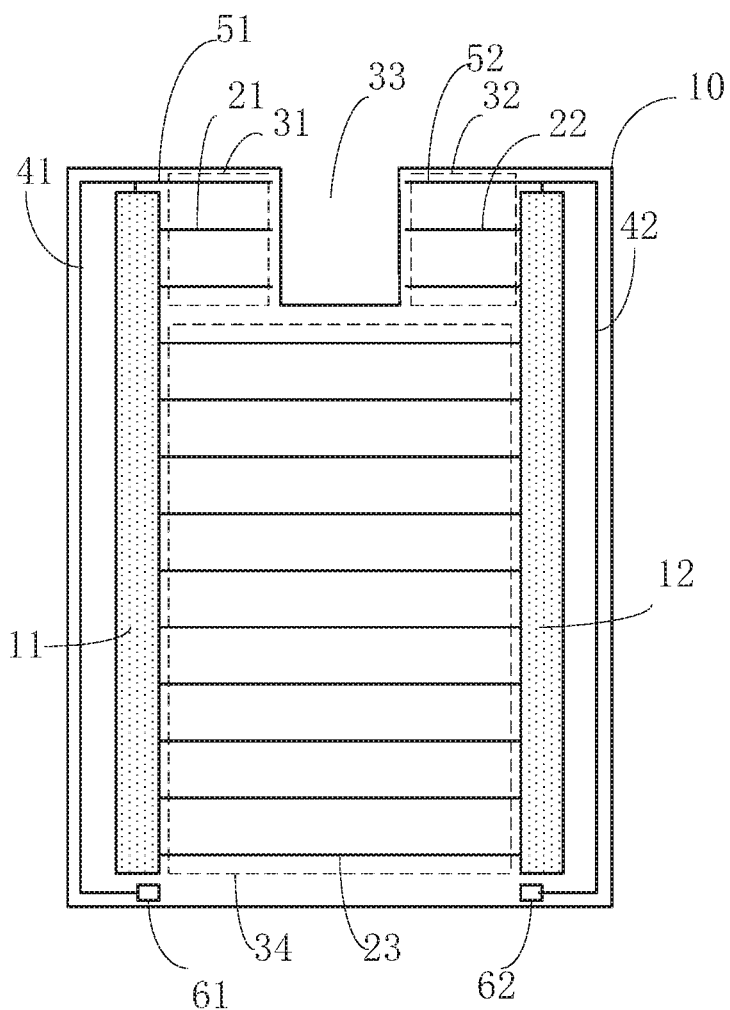
FIG. 1 is a schematic structural diagram of a display panel according to an embodiment of the present disclosure.

The specific structures and functional details disclosed herein are merely representative and are for the purpose of describing exemplary embodiments of the present disclosure. In addition, this disclosure can be implemented in many alternative forms, and should not be interpreted as being limited to the embodiments set forth herein.

In the description of the present disclosure, it should be understood that terms such as "center", "lateral", "upper", "lower", "left", "right", "vertical", "horizontal", "top", "bottom", "inside", "outside", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified. In addition, the term "comprises" and its variations are intended to cover a non-exclusive inclusion.

In the description of the present disclosure, it should be noted that unless there are express rules and limitations, the terms such as "mount," "connect," and "bond" should be comprehended in broad sense. For example, it can mean a supportive connection, a detachable connection, or an integrated connection; it can mean a mechanical connection, or an electrical connection; it can mean a direct connection, an indirect connection by an intermediate, or an inner communication between two elements. A person skilled in the art should understand the specific meanings in the present disclosure according to specific situations.

The terminology used herein is for the purpose of describing particular embodiments and is not intended to limit the exemplary embodiments. The singular forms "a", "an" are also intended to include the plural, unless otherwise specified. It is also to be understood that the terms "comprise" and/or "include" specify described features, integers, steps, operations, units, and/or components without excluding one or more other features, integers, steps, operations, units, components, and/or combinations thereof.

The embodiments of the present disclosure are described in detail hereinafter. Examples of the described embodiments are given in the accompanying drawings.

As shown in FIG. 1, a display panel comprises a substrate 10, and a first connecting line 51, a second connecting line 52, a first gate driver on array (GOA) circuit 11, and a second GOA circuit 12 disposed on the substrate 10. The first GOA circuit 11 is disposed opposite to the second GOA circuit 12, and a first single-sided driving area 31 and a second single-sided driving area 32 are sequentially disposed between the first GOA circuit 11 and the second GOA circuit 12. The first connecting line 51 is disposed in the first single-sided driving area 31 and connected to an input terminal of the first GOA circuit 11, and the second connecting line 52 is disposed in the second single-sided driving area 32 and connected to an input terminal of the second GOA circuit 12.

Wherein, the first GOA circuit 11 and the second GOA circuit 12 are disposed at two opposite edges of the display panel, and are both within a non-display area of the display panel. The first single-sided driving area 31 is a display area driven by the first GOA circuit 11 using single-sided driving, and the second single-sided driving area 32 is a display area driven by the second GOA circuit 12 using the single-sided driving.

If signals input by the first GOA circuit 11 and the second GOA circuit 12 are inconsistent when an aging test is performed, it will lead to poor allocation between the first single-sided driving area 31 and the second single-sided driving area 32. Therefore, the present disclosure allows the input terminal of the first GOA circuit 11 to be connected to the input terminal of the second GOA circuit 12 through the first connecting line 51 and the second connecting line 52, thereby ensuring the signals input by the first GOA circuit 11 and the second GOA circuit 12 are consistent.

Further, a profile-cutting area 33 is disposed between the first single-sided driving area 31 and the second single-sided driving area 32, and the profile-cutting area 33 in the display panel is used to be cut and forms a notch structure.

It should be noted that during the aging test, the first connecting line 51 and the second connecting line 52 may be connected as one connecting line, and the connecting line is disposed in the first single-sided driving area 31, the profile-cutting area 33, and the second single-sided driving area 32. After the aging test, the substrate 10 and the connecting line corresponding to the profile-cutting area 33 are cut, and the retained connecting line constitutes the first connecting line 51 in the first single-sided driving area 31 and the second connecting line 52 in the second single-sided driving area 32.

Further, the display panel further includes a first scanning line 21 and a second scanning line 22 disposed on the substrate 10. The first scanning line 21 is disposed in the first single-sided driving area 31 and connected to a first output terminal of the first GOA circuit 11, and the second scanning line 22 is disposed in the second single-sided driving area 32 and connected to a first output terminal of the second GOA circuit 12.

Wherein, the first scanning line 21 includes a plurality of sub scanning lines, the first GOA circuit 11 includes a plurality of first GOA units (not shown in the figure) corresponding to the sub scanning lines, output terminals of every first GOA unit of the first GOA circuit 11 constitute the first output terminal of the first GOA circuit 11, and each sub scanning line of the first scanning line 21 is connected to each output terminal of corresponding first GOA unit of the first GOA circuit 11. The second scanning line 22 includes a plurality of sub scanning lines, the second GOA circuit 12 includes a plurality of first GOA units (not shown in the figure) corresponding to the sub scanning lines, output terminals of every first GOA unit of the second GOA circuit 12 constitute the first output terminal of the second GOA circuit 12, and each sub scanning line of the second scanning line 22 is connected to each output terminal of corresponding first GOA unit of the second GOA circuit 12.

The first scanning line 21 is used to transmit scanning signals and emitting signals output by the first GOA circuit 11, which allows the first GOA circuit 11 to drive pixels in the first single-sided driving area 31 by the single-sided driving method. The second scanning line 22 is used to transmit scanning signals and emitting signals output by the second GOA circuit 12, which allows the second GOA circuit 12 to drive pixels in the second single-sided driving area 32 by the single-sided driving method.

Further, a double-sided driving area 34 is further disposed between the first GOA circuit 11 and the second GOA circuit 12. The display panel further includes a third scanning line 23 disposed on the substrate 10, and the third scanning line 23 is disposed in the double-sided driving area 34 and respectively connected to a second output terminal of the first GOA circuit 11 and a second output terminal of the second GOA circuit 12.

Wherein, the third scanning line 23 includes a plurality of sub scanning lines, the first GOA circuit 11 includes a plurality of second GOA units (not shown in the figure) corresponding to the sub scanning lines, and output terminals of every second GOA unit of the first GOA circuit 11 constitute the second output terminal of the first GOA circuit 11; and the second GOA circuit 12 includes a plurality of second GOA units (not shown in the figure) corresponding to the sub scanning lines, output terminals of every second GOA unit of the second GOA circuit 12 constitute the second output terminal of the second GOA circuit 12, and two ends of each sub scanning line of the third scanning line 23 are respectively connected to the output terminals of the two corresponding second GOA units of the first GOA circuit 11 and the second GOA circuit 12.

The third scanning line 23 is used to transmit scanning signals and emitting signals output by the first GOA circuit 11 and the second GOA circuit 12, which allows the first GOA circuit 11 and the second GOA circuit 12 to drive pixels in the double-sided driving area 34 by double-sided driving.

Further, the display panel further comprises a first signal input line 41 and a second signal input line 42 disposed on the substrate 10. The first signal input line 41 is disposed on one side of the first GOA circuit 11 away from the second GOA circuit 12, one end of the first signal input line 41 is connected to the input terminal of the first GOA circuit 11, and another end of the first signal input line 41 is provided with a first lighting test point 61; and the second signal input line 42 is disposed on one side of the second GOA circuit 12 away from the first GOA circuit 11, one end of the second signal input line 42 is connected to the input terminal of the second GOA circuit 12, and another end of the second signal input line 42 is provided with a second lighting test point 62.

Wherein, the first signal input line 41 and the second signal input line 42 are used to input signals such as CK, XCK, STV, VGH, and VGL. A plurality of GOA units of the first GOA circuit 11 are arranged along an edge of the display panel, the first signal input line 41 is disposed on one side of the first GOA circuit 11 away from the first scanning line 21, and each input terminal of the GOA units of the first GOA circuit 11 is connected to the first signal input line 41. A plurality of GOA units of the second GOA circuit 12 are arranged along another edge of the display panel, the second signal input line 42 is disposed on one side of the second GOA circuit 12 away from the second scanning line 22, and each input terminal of the GOA units of the second GOA circuit 12 is connected to the second signal input line 42.

In the embodiment of the present disclosure, as shown in FIG. 1, one end of the first signal input line 41 may be provided with the lighting test point 61, and one end of the second signal input line 42 may be provided with the lighting test point 62. During the aging test, a lighting signal is input to the first signal input line 41 through the lighting test point 61, and another lighting signal is input to the second signal input line 42 through the lighting test point 62, which light up the display panel and realize the aging test of the display panel. A main function of the aging test is to eliminate bright spots.

Since the first signal input line 41 and the first connecting line 51 are both connected to the input terminal of the first GOA circuit 11, the first signal input line 41 is connected to the first connecting line 51. Since the second signal input line 42 and the second connecting line 52 are both connected to the input terminal of the second GOA circuit 12, the second signal input line 42 is connected to the second connecting line 52. In the aging test, the first connecting line 51 is connected to the second connecting line 52, so the first signal input line 41 is connected to the second signal input line 42, which makes signals input to the first GOA circuit 11 and the second GOA circuit 12 consistent, thereby preventing screen tearing which is caused by single-sided driving and improving the yield of the display panel.

After the aging test of the display panel, it is necessary to disconnect the first connecting line 51 and the second connecting line 52, for example, cutting the connecting line between the first connecting line 51 and the second connecting line 52, in a bid to prevent additional wiring space from being occupied.

By disposing the first connecting line in the first single-sided driving area and connecting the first connecting line to the input terminal of the first GOA circuit, and by disposing the second connecting line in the second single-sided driving area and connecting the second connecting line to the input terminal of the second GOA circuit, the embodiment of present disclosure can connect the first connecting line to the second connecting line when a lighting signal is respectively input to the input terminal of the first GOA circuit and the input terminal of the second GOA circuit, which ensures consistencies of input signals of the GOA circuits at both sides, thereby preventing screen tearing which is caused by single-sided driving when performing the aging test, and improving the yield of the display panel.

Figure 2:
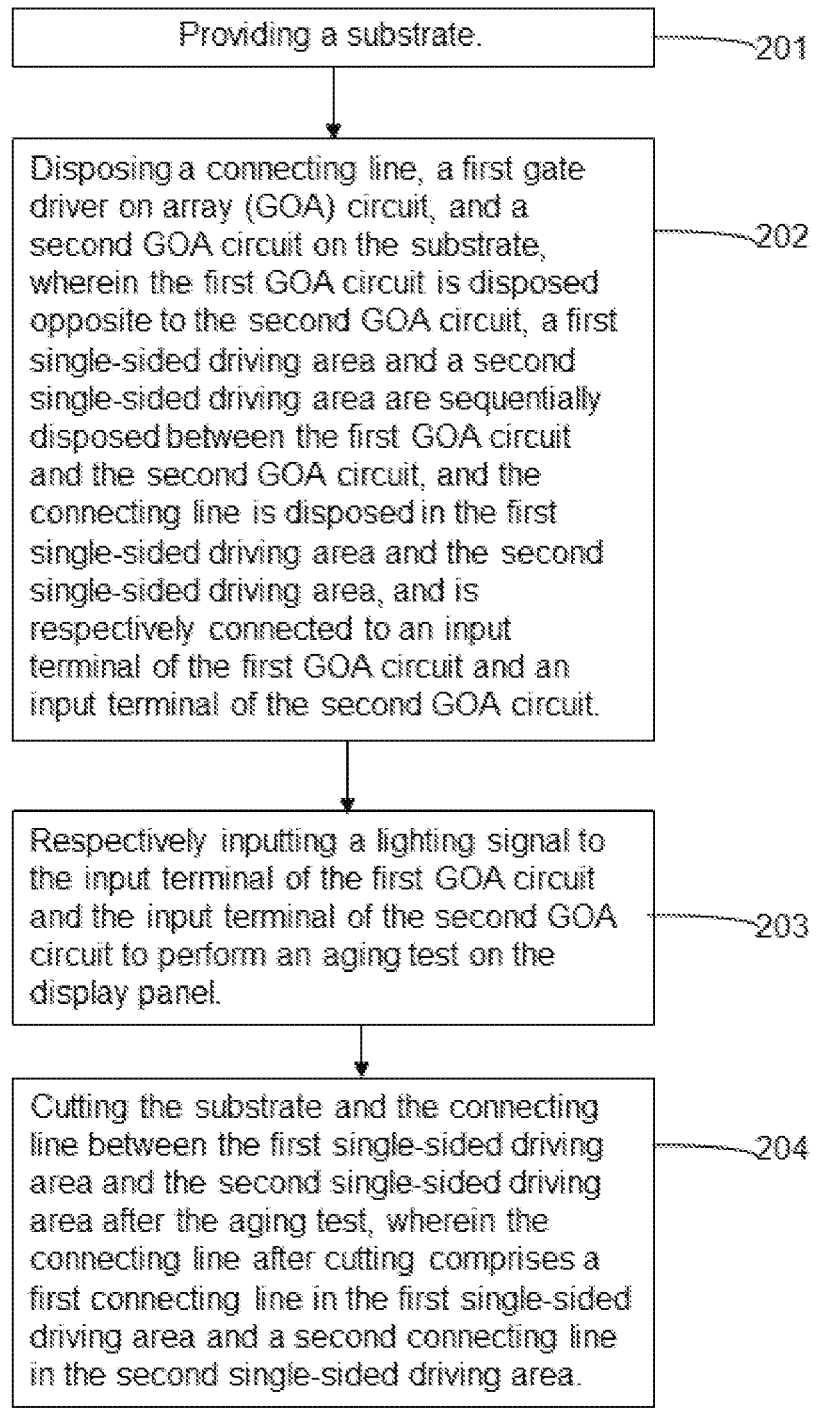
FIG. 2 is a flowchart of a manufacturing method of a display panel according to an embodiment of the present disclosure.

As shown in FIG. 2, an embodiment of the present disclosure further provides a manufacturing method of a display panel, which includes following steps:

step 201: providing a substrate.

Step 202: disposing a connecting line, a first gate driver on array (GOA) circuit, and a second GOA circuit on the substrate, wherein the first GOA circuit is disposed opposite to the second GOA circuit, a first single-sided driving area and a second single-sided driving area are sequentially disposed between the first GOA circuit and the second GOA circuit, and the connecting line is disposed in the first single-sided driving area and the second single-sided driving area, and is respectively connected to an input terminal of the first GOA circuit and an input terminal of the second GOA circuit.

Figure 3:
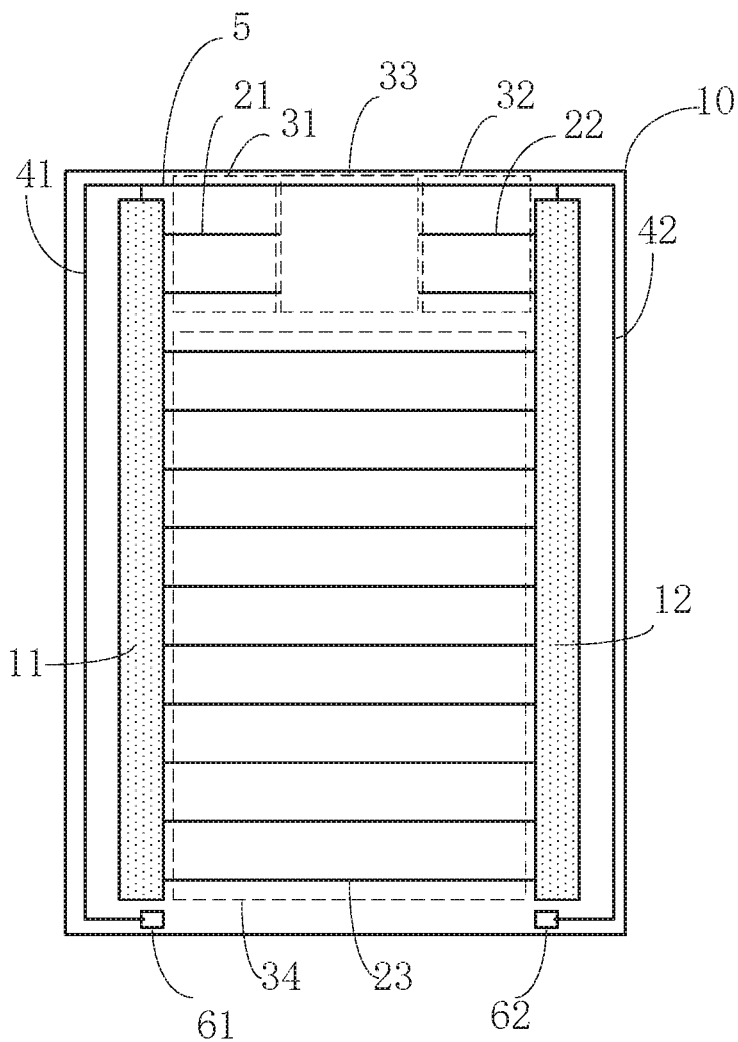
FIG. 3 is a schematic structural diagram of a display panel in a step 202 of the manufacturing method of the display panel.

In the embodiment, as shown in FIG. 3, the first GOA circuit 11 and the second GOA circuit 12 are disposed at two opposite edges of the display panel, and are both within a non-display area of the display panel. The first single-sided driving area 31 is a display area driven by the first GOA circuit 11 using single-sided driving, and the second single-sided driving area 32 is a display area driven by the second GOA circuit 12 using the single-sided driving.

If signals input by the first GOA circuit 11 and the second GOA circuit 12 are inconsistent when an aging test is performed, it will lead to poor allocation between the first single-sided driving area 31 and the second single-sided driving area 32. Therefore, the present disclosure allows the input terminal of the first GOA circuit 11 to be connected to the input terminal of the second GOA circuit 12 through the connecting line 5, thereby ensuring the signals input by the first GOA circuit 11 and the second GOA circuit 12 are consistent.

Further, the method also includes:

disposing a first scanning line and a second scanning line on the substrate, wherein the first scanning line is disposed in the first single-sided driving area and connected to a first output terminal of the first GOA circuit, and the second scanning line is disposed in the second single-sided driving area and connected to a first output terminal of the second GOA circuit.

As shown in FIG. 3, the first scanning line 21 is used to transmit scanning signals and emitting signals output by the first GOA circuit 11, which allows the first GOA circuit 11 to drive pixels in the first single-sided driving area 31 by the single-sided driving method. Meanwhile, the second scanning line 22 is used to transmit scanning signals and emitting signals output by the second GOA circuit 12, which allows the second GOA circuit 12 to drive pixels in the second single-sided driving area 32 by the single-sided driving method.

Further, the method also includes:

disposing a third scanning line on the substrate, wherein a double-sided driving area is further disposed between the first GOA circuit and the second GOA circuit, and the third scanning line is disposed in the double-sided driving area and respectively connected to a second output terminal of the first GOA circuit and a second output terminal of the second GOA circuit.

As shown in FIG. 3, the third scanning line 23 is used to transmit scanning signals and emitting signals output by the first GOA circuit 11 and the second GOA circuit 12, which allows the first GOA circuit 11 and the second GOA circuit 12 to drive pixels in the double-sided driving area 34 by double-sided driving.

Further, the method also includes:

disposing a first signal input line and a second signal input line on the substrate, wherein the first signal input line is disposed on one side of the first GOA circuit away from the second GOA circuit, one end of the first signal input line is connected to the input terminal of the first GOA circuit, and another end of the first signal input line is provided with a first lighting test point; and the second signal input line is disposed on one side of the second GOA circuit away from the first GOA circuit, one end of the second signal input line is connected to the input terminal of the second GOA circuit, and another end of the second signal input line is provided with a second lighting test point.

As shown in FIG. 3, the first signal input line 41 and the second signal input line 42 are used to input signals such as CK, XCK, STV, VGH, and VGL.

Step 203: respectively inputting a lighting signal to the input terminal of the first GOA circuit and the input terminal of the second GOA circuit to perform an aging test on the display panel.

During the aging test, a lighting signal is input to the first signal input line 41 and the first GOA circuit 11 through the lighting test point 61, and another lighting signal is input to the second signal input line 42 and the second GOA circuit 12 through the lighting test point 62, which light up the display panel and realize the aging test of the display panel. A main function of the aging test is to eliminate bright spots.

Step 204: cutting the substrate and the connecting line between the first single-sided driving area and the second single-sided driving area after the aging test, wherein the connecting line after cutting comprises a first connecting line in the first single-sided driving area and a second connecting line in the second single-sided driving area.

As shown in FIG. 1, the connecting line 5 is disconnected, for example, the connecting line 5 between the first single-sided driving area 31 and the second single-sided driving area 32 is disconnected.

Specifically, a profile-cutting area 33 is disposed between the first single-sided driving area 31 and the second single-sided driving area 32, and the connecting line 5 is also disposed in the profile-cutting area 33.

The step of cutting the substrate and the connecting line between the first single-sided driving area and the second single-sided driving area specifically includes:

cutting the substrate and the connecting line in the profile-cutting area.

As shown in FIG. 1, when cutting the substrate 10 corresponding to the profile-cutting area 33, the connecting line 5 passing through the profile-cutting area 33 will be cut at a same time, forming the display panel having a notch structure.

By disposing the first connecting line in the first single-sided driving area and connecting the first connecting line to the input terminal of the first GOA circuit, and by disposing the second connecting line in the second single-sided driving area and connecting the second connecting line to the input terminal of the second GOA circuit, the embodiment of present disclosure can connect the first connecting line to the second connecting line when a lighting signal is respectively input to the input terminal of the first GOA circuit and the input terminal of the second GOA circuit, which ensures consistencies of input signals of the GOA circuits at both sides, thereby preventing screen tearing which is caused by single-sided driving when performing the aging test, and improving the yield of the display panel.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising a substrate, and a first connecting line, a second connecting line, a first gate driver on array (GOA) circuit, and a second GOA circuit disposed on the substrate;

wherein the first GOA circuit is disposed opposite to the second GOA circuit, and a first single-sided driving area and a second single-sided driving area are spacedly disposed between the first GOA circuit and the second GOA circuit, the first single-sided driving area is disposed adjacent to the first GOA circuit, the second single-sided driving area is disposed adjacent to the second GOA circuit, and a double-sided driving area is disposed between the first GOA circuit and the second GOA circuit and is disposed adjacent to the first GOA circuit and the second GOA circuit; and the first connecting line is disposed in the first single-sided driving area and connected to an input terminal of the first GOA circuit, and the second connecting line is disposed in the second single-sided driving area and connected to an input terminal of the second GOA circuit, the first single-sided driving area, the second single-sided driving area, and the double-sided driving area form a display area of the display panel, and the first GOA circuit and the second GOA circuit are within a non-display area of the display panel.

2. The display panel according to claim 1, further comprising a first scanning line and a second scanning line disposed on the substrate, wherein the first scanning line is disposed in the first single-sided driving area and connected to a first output terminal of the first GOA circuit, and the second scanning line is disposed in the second single-sided driving area and connected to a first output terminal of the second GOA circuit.

3. The display panel according to claim 1, wherein
the display panel further comprises a third scanning line disposed on the substrate, and the third scanning line is disposed in the double-sided driving area and respectively connected to a second output terminal of the first GOA circuit and a second output terminal of the second GOA circuit.

4. The display panel according to claim 1, further comprising a first signal input line and a second signal input line disposed on the substrate;

wherein the first signal input line is disposed on one side of the first GOA circuit away from the second GOA circuit, one end of the first signal input line is connected to the input terminal of the first GOA circuit, and another end of the first signal input line is provided with a first lighting test point; and the second signal input line is disposed on one side of the second GOA circuit away from the first GOA circuit, one end of the second signal input line is connected to the input terminal of the second GOA circuit, and another end of the second signal input line is provided with a second lighting test point.

5. The display panel according to claim 1, wherein a profile-cutting area is disposed between the first single-sided driving area and the second single-sided driving area.

6. A manufacturing method of a display panel, comprising following steps:

providing a substrate;

disposing a connecting line, a first gate driver on array (GOA) circuit, and a second GOA circuit on the substrate, wherein the first GOA circuit is disposed opposite to the second GOA circuit, a first single-sided driving area and a second single-sided driving area are spacedly disposed between the first GOA circuit and the second GOA circuit, the first single-sided driving area is disposed adjacent to the first GOA circuit, the second single-sided driving area is disposed adjacent to the second GOA circuit, and the connecting line passes through the first single-sided driving area and the second single-sided driving area and is respectively connected to an input terminal of the first GOA circuit and an input terminal of the second GOA circuit;

respectively inputting a lighting signal to the input terminal of the first GOA circuit and the input terminal of the second GOA circuit to perform an aging test on the display panel; and cutting the substrate and the connecting line between the first single-sided driving area and the second single-sided driving area after the aging test, wherein the connecting line after cutting comprises a first connecting line in the first single-sided driving area and a second connecting line in the second single-sided driving area.

7. The manufacturing method of the display panel according to claim 6, wherein a profile-cutting area is disposed between the first single-sided driving area and the second single-sided driving area, and the connecting line passes through the profile-cutting area;

cutting the substrate and the connecting line between the first single-sided driving area and the second single-sided driving area comprises a following step: cutting the substrate and the connecting line in the profile cutting area.

8. The manufacturing method of the display panel according to claim 6, further comprising a following step:

disposing a first scanning line and a second scanning line on the substrate, wherein the first scanning line is disposed in the first single-sided driving area and connected to a first output terminal of the first GOA circuit, and the second scanning line is disposed in the second single-sided driving area and connected to a first output terminal of the second GOA circuit.

9. The manufacturing method of the display panel according to claim 6, further comprising a following step: disposing a third scanning line on the substrate, wherein a double-sided driving area is further disposed between the first GOA circuit and the second GOA circuit and is disposed adjacent to the first GOA circuit and the second GOA circuit, and the third scanning line is disposed in the double-sided driving area and respectively connected to a second output terminal of the first GOA circuit and a second output terminal of the second GOA circuit.

10. The manufacturing method of the display panel according to claim 6, further comprising a following step: disposing a first signal input line and a second signal input line on the substrate, wherein the first signal input line is disposed on one side of the first GOA circuit away from the second GOA circuit, one end of the first signal input line is connected to the input terminal of the first GOA circuit, and another end of the first signal input line is provided with a first lighting test point; and the second signal input line is disposed on one side of the second GOA circuit away from the first GOA circuit, one end of the second signal input line is connected to the input terminal of the second GOA circuit, and another end of the second signal input line is provided with a second lighting test point.

* * * * *